United States Patent
Mayer

(10) Patent No.: US 6,914,834 B2
(45) Date of Patent: Jul. 5, 2005

(54) SYSTEM AND METHOD FOR THE FUNCTIONAL TESTING OF SEMICONDUCTOR MEMORY CHIPS

(75) Inventor: Peter Mayer, München (DE)

(73) Assignee: Infineon Technologies AG, Munich (DE)

(*) Notice: Subject to any disclaimer, the term of this patent is extended or adjusted under 35 U.S.C. 154(b) by 240 days.

(21) Appl. No.: 10/424,347

(22) Filed: Apr. 28, 2003

(65) Prior Publication Data

US 2004/0015314 A1 Jan. 22, 2004

(30) Foreign Application Priority Data

Apr. 26, 2002 (DE) .......................................... 102 18 787

(51) Int. Cl.[7] .............................................. G11C 29/00
(52) U.S. Cl. .................. 365/201; 365/230.03; 365/212; 702/117; 714/724
(58) Field of Search ........................... 365/201, 230.03, 365/212, 202, 190, 189.01; 702/117; 714/724

(56) References Cited

U.S. PATENT DOCUMENTS

| | | | |
|---|---|---|---|
| 5,946,246 A | * | 8/1999 | Jun et al. .................... 365/201 |
| 6,161,206 A | * | 12/2000 | Wasson ....................... 714/738 |
| 6,169,695 B1 | | 1/2001 | Duesman |

* cited by examiner

Primary Examiner—Van Thu Nguyen
Assistant Examiner—Dang T. Nguyen
(74) Attorney, Agent, or Firm—Laurence A. Greenberg; Werner H. Stemer; Ralph E. Locher

(57) ABSTRACT

A system and a method for functionally testing fast semiconductor memory chips. The data shifting method proposed here is based on the fact that a low speed tester writes data and data strobe test patterns to a memory block with a low clock frequency. The connection between the tester and the memory chip is subsequently disconnected for all the data and data strobe lines. This can be done by a relay or integrated circuits on an external circuit board or by test modes in the output circuit of the memory chip, that is to say on-chip. The data and data strobe lights are subsequently divided into two groups of the same size and connected to one another. The data and data strobe test pattern written to the first memory block is then shifted with a high clock frequency into a second memory block, from where it is then shifted back into the first memory block in a further read-write cycle with the high clock frequency. The data pattern can subsequently be read out with a low clock frequency by the low speed tester and evaluated.

13 Claims, 2 Drawing Sheets

SYSTEM AND METHOD FOR THE FUNCTIONAL TESTING OF SEMICONDUCTOR MEMORY CHIPS

BACKGROUND OF THE INVENTION

Field of the Invention

The invention relates to a system and a method for the functional testing of a semiconductor memory chip, in particular of a DRAM or SGRAM chip which can be operated in the DDR mode, in which the memory cells are subdivided into a plurality of spatially separate memory blocks.

In order to keep up with the rising requirements with regard to bandwidths and volumes of data in the information industry, DRAM or SGRAM memories with ever higher data rates or clock frequencies must be developed. In the field of graphics, clock frequencies of 400 MHz and a resultant data rate (double data rate) of 800 Mbits/s have been attained in the meantime, with further increases in the clock frequencies being expected. Even the most modern test units (memory testers) no longer have the accuracy and speed to test the interfaces of future products with even higher data rates, which interfaces write and read out data with such high clock frequencies. The limit of the data rate is primarily determined by the data path synchronization and the limiting parameters of the input and output stages of the data lines, that is to say by the memory interface. By contrast, the speed in the core, that is to say in the memory cells and the sense amplifiers, scarcely increases through the use of a higher "prefetch".

In the prior art, the interface of the memory chips is still measured by very fast and expensive memory testers. The costs for such test units are very high and are manifested to an ever greater extent in the production costs of the memory chips. At the ever increasing clock frequencies, the speed limit of the tester hardware is often already being approached and it is necessary to accept a loss of yield on account of measurement inaccuracies. Moreover, at high speeds the tester can no longer evaluate all the data. On account of these limitations, an interface test that reflects the conditions in the later application is no longer possible.

For the forthcoming generation of very fast memories, to date there is as yet no method that allows the testing of the interface at maximum module speed.

SUMMARY OF THE INVENTION

It is accordingly an object of the invention to provide a system and a method for the functional testing of semiconductor memory chips that overcome the above-mentioned disadvantages of the prior art devices and methods of this general type, which enable the testing of the interface at maximum module speed.

With the foregoing and other objects in view there is provided, in accordance with the invention, a system for functionally testing a semiconductor memory chip having memory cells subdivided into a plurality of spatially separate memory blocks, including a first memory block and a second memory block. The system contains test pattern loading means for externally loading a selected test pattern to the first memory block using one of low clock frequency and a low data rate and a selected address offset for the first memory block. The selected test pattern contains data signals and/or data strobe signals. The test pattern loading means subsequently disconnects the connection to the semiconductor memory chip. Data lines and data strobe lines are connected to the test pattern loading means. First circuit means are connected to the data lines and to the data strobe lines. The first circuit means upon activation of a functional test mode, divides at least one of the data lines and the data strobe lines between the first and second memory blocks of the semiconductor memory chip into two groups of equivalent size and connects them to one another. Second circuit means are connected to the data lines and the data strobe lines. The second circuit means by a first read-write cycle, shifts the selected test pattern previously loaded into the first memory block into the second memory block with a high clock frequency or a high data rate and subsequently, by a second read-write cycle, shifts the selected test pattern stored in the second memory block with the high clock frequency or the high data rate in an opposite direction back into the first memory block again. Test pattern read-out means are provided for reading out and evaluating the selected test pattern shifted back into the first memory block.

The proposed method is based on the fact that, from the outside, for example by a "low speed tester", test information is written to one of the spatially separate memory blocks of the memory chip with a low clock frequency or data rate. The connection between the test unit and memory is subsequently disconnected for all the data and data strobe lines. This can be done either externally, that is to say outside the memory chip on a load board, or by test modes in the output circuit of the memory, that is to say on-chip. The data lines and data strobe lines are divided into two groups of the same size and connected to one another. This connection is likewise possible externally or internally. With the aid of a test mode, the data are written at maximum clock frequency from one memory block to another. The initiation of the test mode can also be effected with the aid of a low speed tester since no data evaluation is necessary in this case. A further read-write cycle with maximum clock frequency is subsequently effected in the opposite direction, so that the data and/or data strobe test patterns are present in the first memory block again. As a result, reading and writing has been affected at maximum speed on all the data and data strobe lines.

If the "new" data pattern that has been stored in the first memory block again is read out again at a low clock frequency or data rate by the low speed tester, the functionality of the memory interface can be tested with the prerequisite of a suitable data pattern and address offset.

Consequently, the functional test system and method of the invention enables an accurate and application-conforming measurement of memory interfaces operated in the double data rate mode under the conditions of the high clock frequency or high data rate by virtue of the memory primarily testing itself. As a result, the test costs can be significantly reduced and, moreover, for the method there is no upper limit whatsoever for the clock frequency or the data rate, so that it can also be used even for much faster interfaces.

In accordance with an added feature of the invention, the second circuit means has adjustably variable delay devices for programmable time control of the data signals and the data strobe signals that are written in and read out with the high clock frequency or the high data rate.

In accordance with another feature of the invention, the first circuit means has a test mode block for switching the first and second memory blocks, upon receiving a functional test mode activation signal from the test pattern loading means, independently in each case of write and read modes, and sets a delay of the delay devices for the data signals and the data strobe signals forming the selected test pattern.

In accordance with a further feature of the invention, the first and second circuit means are disposed externally to the semiconductor memory chip. Alternatively, the first and second circuit means can be disposed on the semiconductor memory chip.

Other features which are considered as characteristic for the invention are set forth in the appended claims.

Although the invention is illustrated and described herein as embodied in a system and a method for the functional testing of semiconductor memory chips, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
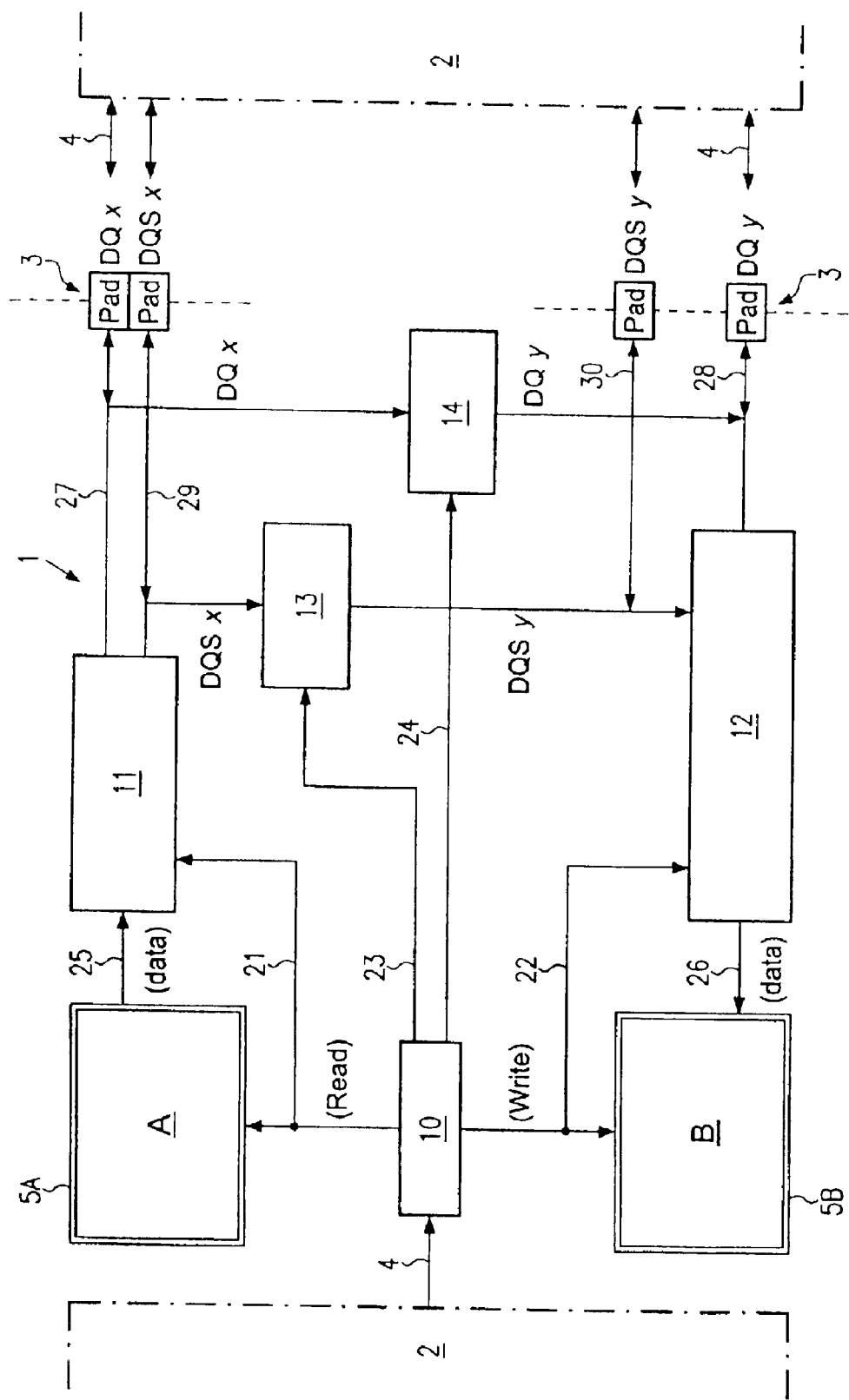
FIG. 1 is a schematic block diagram of an exemplary embodiment of a system according to the invention for the functional test of fast semiconductor memory chips.

Referring now to the figures of the drawing in detail and first, particularly, to FIG. 1 thereof, there is shown a schematic block diagram of first and second circuit means or devices of a functional test system 1, an interface of a memory chip, which interface is represented by pads 3 and line runs 4, and an external test unit 2. By way of example, two individual memory blocks 5A and 5B of a memory chip are emphasized by a double line. A test mode block 10 is provided for switching over the memory blocks 5A and 5B independently of external write and read signals and for controlling a delay of a data line and a data strobe line. Block 11 is a data path for data read from the memory block 5A and contains synchronization and driver circuits. Block 12 is a data path for data to be written in and contains synchronization and receiver circuits.

Block 13 symbolizes a variable and adjustable delay circuit for data strobe signals DQSX (undelayed) and DQSY (delayed). In a similar manner, block 14 contains variable and adjustable delay circuits for data signals DQX (undelayed) and DQY (delayed). The delay of the delay circuits represented by the blocks 13 and 14 for the data strobe signals and the data signals can be set or programmed by the test mode block 10 via lines 23 and 24.

Line runs 25 and 26 are respectively data lines from the memory block 5A and to the memory block 5B. The test mode block 10 induces read and write requests via the lines 21 and 22. Lines 27 and 29 respectively illustrate incoming and outgoing lines for the undelayed data signals DQX and the undelayed data strobe signals DQSX while lines 28 and 30 respectively conduct incoming and outgoing delayed data and data strobe signals DQY and DQSY.

FIG. 1 illustrates, by way of example, a connection of the data lines in the chip for in each case one DQ from the two different memory blocks 5A and 5B. In this example, the external test unit 2 writes data and data strobe test patterns to the first memory block 5A with an expedient address offset. The test patterns written in are read out via DQX and DQSX and are written to the second memory block 5B via the data path 11 and the delay circuits 13, 14 and the data path 12 with the highest clock frequency. This operation is subsequently reversed, in which case, with the high clock frequency, the data and data strobe test patterns that have been stored in the second memory block 5B are shifted back into the first memory block 5A again via the block 12, 14 and/or 13 and 11 in a second read-write cycle. Although only two memory blocks 5A and 5B are shown by way of example in FIG. 1, it is directly understood that the procedure can be performed with more than two, for example with 4, 8 or 16, memory blocks. It should be mentioned that all the data and data strobe lines 4 between the test unit 2 and the memory chip to be tested are interrupted during the shifting—effected with the high clock frequency—of the data and data strobe test patterns from the memory block 5A to the memory block 5B (and vice versa). This can be done for example by relays or integrated circuits on an external load board or else by test modes in the output circuit of the memory chip itself, that is to say internally.

The data and data strobe lines of the chip are divided into two groups of the same size and connected to one another. This connection may be realized externally or internally on the chip. The following configuration may be implemented for an SGRAM that can be operated in the DDR mode:

DQ0 is connected to DQ8,

DQ2 to DQ9, . . .

DQ7 to DQ15,

DQS0 to DQS1 (+delay),

DQ16 to DQ24,

DQ23 to DQ31 and

DQS2 to DQS3 (+delay).

It has become clear to the relevant persons skilled in the art that the construction illustrated in FIG. 1 is merely by way of example. The test unit 2 may, of course, also be a test board configured especially for this purpose, or a test chip, for example in the manner of a so-called built outside tester.

The functional test system according to the invention for testing fast semiconductor chips is accordingly characterized by:

a) test pattern loading means or device 2–4, 11, 12, including the line systems 25–30, in order to load externally, that is to say from the test unit 2 into the memory chip, for example into the memory block 5A, a selected test pattern for data and/or data strobe signals DQ, DQS with a low clock frequency or data rate and a selected address offset and subsequently to disconnect the connection of the data lines and data strobe lines between the test unit 2 and the memory chip;

b) first circuit means or device 10, 11, 12, 13, 14, which, upon the activation of a functional test mode, divide the data lines 25, 26, 27, 28 and/or the data strobe lines 29, 30 between in each case two memory blocks, for example 5A and 5B, of the memory chip into two groups of the same size and connect them to one another;

c) second circuit means or device 10, 11, 12, 13, 14, which, by a first read-write cycle, shift the data and/or data strobe test patterns that have previously been written or input into the first memory block, for example 5A, into the second memory block, for example 5B, connected to it, with a high clock frequency or data rate and subsequently, by a second read-write cycle, shift the data and/or data strobe test patterns stored in the second memory block, for example 5b, with the high clock frequency or data rate in the opposite direction back into the first memory block, for example 5A, again; and d) test pattern read-out means or device, namely the data path 11 and the connected lines 25, 27 and 29 and the external lines 4, which read out the data and/or data strobe test patterns that have been shifted back into the first memory block, for example 5A, with a low clock and feed them to the test unit 2 for evaluation.

As already mentioned, the second circuit means contains adjustably variable delay circuits 13 and 14 for the programmable time control of the shifting operations for the data and data strobe test pattern signals. The setup and hold times can be measured by these variably adjustable delays.

The first and second circuit means or devices can either be disposed outside the memory chip, or, as an alternative, they can be integrated in the output circuit of the memory chip.

Figure 2:
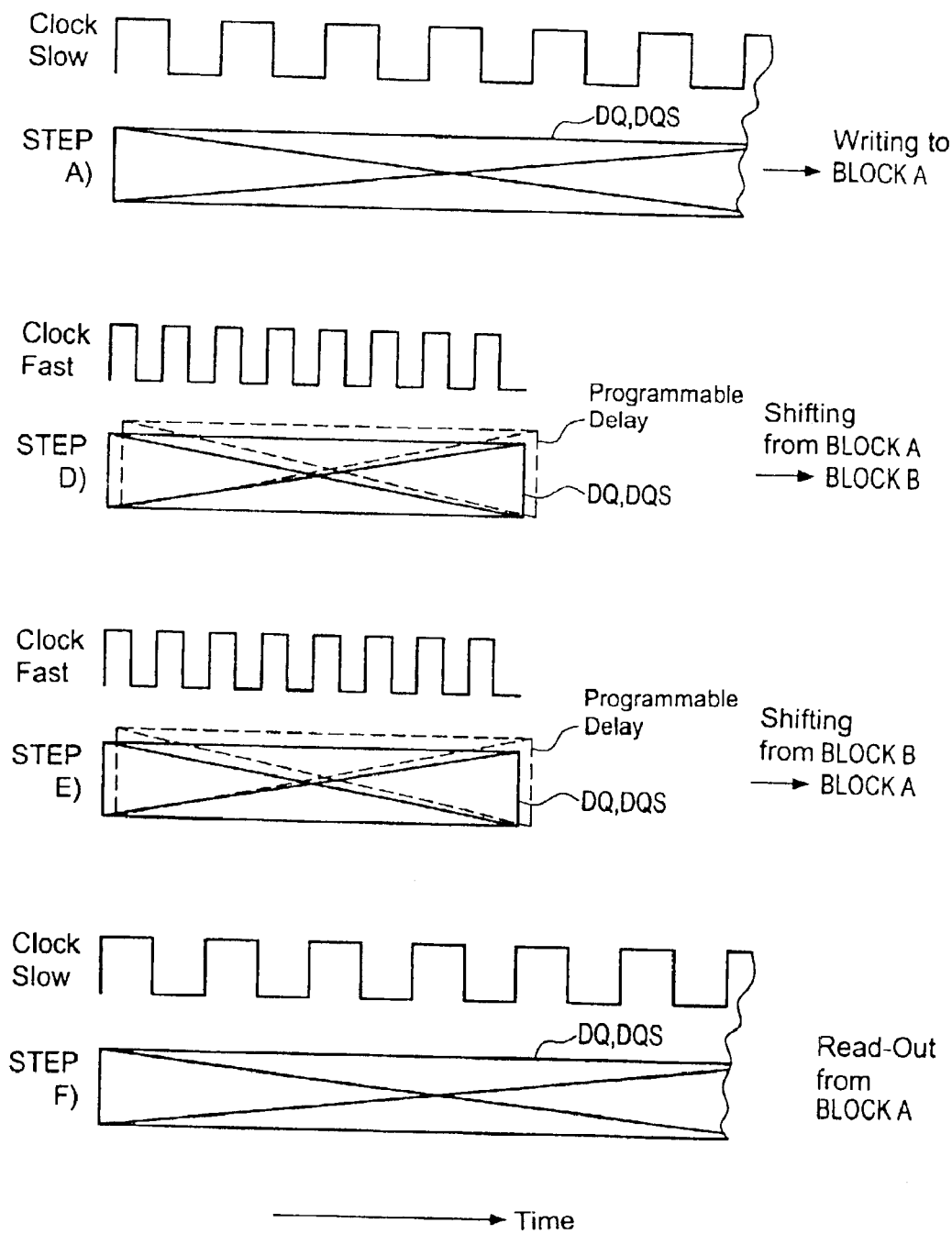
FIG. 2 is a graph showing signal timing diagrams which illustrate individual steps of the method according to the invention.

The functional test system according to the invention as described above performs the following method steps in this order:

Step A: First, selected data and/or data strobe patterns are written or input into one of the memory blocks, for example 5A, with a selected address offset with a slow clock frequency. Step A is illustrated in the first two lines of the signal timing diagram illustrated in FIG. 2.

Steps B and C: The data and/or data strobe lines between one memory block, for example block A, and the other memory block, for example block B, are then divided into two groups of the same size and the two groups of the data and/or data strobe lines between the two memory blocks are connected. The data and data strobe lines 4 coming from the outside, that is to say from the test unit 2, and those going to the outside are interrupted in this case.

Step D: With the high-frequency clock, the data and/or data strobe test patterns that have previously been written to the first memory block, for example 5A, are shifted into the second memory block, for example 5B, which is now connected to it. The step D is illustrated in the third and fourth lines of the signal timing diagram of FIG. 2. In this case, the data and data strobe test patterns can be subjected to an adjustable delay affected by the blocks 14 and 13.

Step E: The data and/or data strobe test patterns that have been stored in the second memory block, for example 5B, are subsequently shifted with the high clock frequency or data rate back into the first memory block, for example 5A, again, in which case a programmable or adjustable delay for the data and data strobe test patterns that are to be shifted back can be effected here, too, by the delay circuits 13 and 14. The fifth and sixth lines of the signal timing diagram illustrate Step E that has just be outlined.

Step F: Finally, the data and/or data strobe test patterns that have been shifted back into the first memory block, for example 5A, are read out with the slow clock frequency or data rate via the data path 11, the lines 27, 29, the pads 3 and the line system 4, which is now again connected to the memory chip to be tested, by the test unit 2 in order to be subjected to an evaluation there. The read-out operation of Step F is illustrated in the last two lines of the signal timing diagram of FIG. 2.

The functional test system according to the invention and the functional test method enable a cost-effective functional test which can be employed even for the next generation of high speed memories operating with even higher clock frequencies, since there is no speed limit for this method, with the result that it can also be used for much faster memory interfaces. The proposed functional test of double data rate memory interfaces under high speed conditions does not need expensive external high speed testers since the memory primarily tests itself.

I claim:

1. A system for functionally testing a semiconductor memory chip having memory cells subdivided into a plurality of spatially separate memory blocks, including a first memory block and a second memory block, the system comprising:

test pattern loading means for externally loading a selected test pattern to the first memory block using one of low clock frequency and a low data rate and a selected address offset for the first memory block, the selected test pattern containing at least one of data signals and data strobe signals, said test pattern loading means subsequently disconnecting a connection to the semiconductor memory chip;

data lines and data strobe lines connected to said test pattern loading means;

first circuit means connected to said data lines and to said data strobe lines, said first circuit means upon activation of a functional test mode, divides at least one of said data lines and said data strobe lines between the first and second memory blocks of the semiconductor memory chip into two groups of equivalent size and connects them to one another;

second circuit means connected to said data lines and said data strobe lines, said second circuit means by a first read-write cycle, shifts the selected test pattern previously loaded into the first memory block into the second memory block with one of a high clock frequency and a high data rate and subsequently, by a second read-write cycle, shifts the selected test pattern stored in the second memory block with one of the high clock frequency and the high data rate in an opposite direction back into the first memory block again; and test pattern read-out means for reading out and evaluating the selected test pattern shifted back into the first memory block.

2. The functional test system according to claim 1, wherein said second circuit means has adjustably variable delay devices for programmable time control of the data signals and the data strobe signals that are written in and read out with the high clock frequency or the high data rate.

3. The functional test system according to claim 2, wherein said first circuit means has a test mode block for switching the first and second memory blocks, upon receiving a functional test mode activation signal from said test pattern loading means, independently in each case of write and read modes, and sets a delay of said delay devices for the data signals and the data strobe signals forming the selected test pattern.

4. The functional test system according to claim 1, wherein said first and second circuit means are disposed externally to the semiconductor memory chip.

5. The functional test system according to claim 1, wherein said first and second circuit means are disposed on the semiconductor memory chip.

6. A system for functionally testing a semiconductor memory chip selected from the group consisting of a DRAM chip operable in a double data rate mode and a SGRAM chip operable in a double data rate mode, the semiconductor memory chip having memory cells subdivided into a plurality of spatially separate memory blocks, including a first memory block and a second memory block, the system comprising:

test pattern loading means for externally loading a selected test pattern to the first memory block using one of low clock frequency and a low data rate and a selected address offset for the first memory block, the selected test pattern containing at least one of data signals and data strobe signals, said test pattern loading means subsequently disconnecting a connection to the semiconductor memory chip;

data lines and data strobe lines connected to said test pattern loading means;

first circuit means connected to said data lines and to said data strobe lines, said first circuit means upon activation of a functional test mode, divides at least one of said data lines and said data strobe lines between the first and second memory blocks of the semiconductor memory chip into two groups of equivalent size and connects them to one another;

second circuit means connected to said data lines and said data strobe lines, said second circuit means by a first read-write cycle, shifts the selected test pattern previously loaded into the first memory block into the second memory block with one of a high clock frequency and a high data rate and subsequently, by a second read-write cycle, shifts the selected test pattern stored in the second memory block with one of the high clock frequency and the high data rate in an opposite direction back into the first memory block again; and test pattern read-out means for reading out and evaluating the selected test pattern shifted back into the first memory block.

7. A method for functionally testing a semiconductor memory chip having memory cells subdivided into a plurality of spatially separate memory blocks, including a first memory block and a second memory block, which comprises the steps of:

writing selected test patterns formed of at least one of data test pattern signals and data strobe test pattern signals into the first memory block using a selected address offset and one of a low clock frequency and a low data rate;

dividing at least one of data lines and data strobe lines between the first memory block and the second memory block into two groups of equivalent sizes resulting in two line groups;

connecting the two line groups between the first and second memory blocks;

shifting the selected test patterns previously written to the first memory block using one of a high clock frequency and a high data rate into the second memory block;

subsequent shifting the selected test patterns stored in the second memory block using one of the high clock frequency and the high data rate back into the first memory block; and reading-out the selected test patterns that were shifted back into the first memory block using one of the low clock frequency and the low data rate from the first memory block.

8. The method according to claim 7, which further comprises subjecting the selected test patterns read out from the first memory block to an external evaluation.

9. The method according to claim 7, which further comprises during the shifting step and the subsequent shifting steps, subjecting the selected test patterns to a respective specific time delay during the shifting, for testing a setup time and hold time for the selected test patterns.

10. The method according to claim 9, which further comprises setting separately the delay time for shifted data test patterns and the delay time for shifted data strobe test patterns in each case.

11. The method according to claim 7, which further comprises carrying out the shifting of the selected test patterns with one of a highest possible clock frequency and a highest possible data rate of the semiconductor memory chip.

12. The method according to claim 7, which further comprises selecting the semiconductor test chip from the group consisting of a DRAM chip operable in a double data rate mode and a SGRAM chip operable in a double data rate mode.

13. A system for functionally testing a semiconductor memory chip having memory cells subdivided into a plurality of spatially separate memory blocks, including a first memory block and a second memory block, the system comprising:

a test pattern loading device for externally loading a selected test pattern to the first memory block using one of low clock frequency and a low data rate and a selected address offset for the first memory block, the selected test pattern containing at least one of data signals and data strobe signals, said test pattern loading device subsequently disconnecting a connection to the semiconductor memory chip;

data lines and data strobe lines connected to said test pattern loading device;

a first circuit device connected to said data lines and to said data strobe lines, said first circuit device upon activation of a functional test mode, divides at least one of said data lines and said data strobe lines between the first and second memory blocks of the semiconductor memory chip into two groups of equivalent size and connects them to one another;

a second circuit device connected to said data lines and said data strobe lines, said second circuit device by a first read-write cycle, shifts the selected test pattern previously loaded into the first memory block into the second memory block with one of a high clock frequency and a high data rate and subsequently, by a second read-write cycle, shifts the selected test pattern stored in the second memory block with one of the high clock frequency and the high data rate in an opposite direction back into the first memory block again; and a test pattern read-out device for reading out and evaluating the selected test pattern shifted back into the first memory block.

* * * * *